(12) United States Patent
Abe et al.

(10) Patent No.: US 7,595,228 B2
(45) Date of Patent: Sep. 29, 2009

(54) METHOD FOR MANUFACTURING ELECTRONIC COMPONENT-MOUNTED BOARD

(75) Inventors: Tomoyuki Abe, Kawasaki (JP); Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 298 days.

(21) Appl. No.: 11/233,177

(22) Filed: Sep. 23, 2005

(65) Prior Publication Data

US 2006/0051895 A1   Mar. 9, 2006

Related U.S. Application Data

(63) Continuation of application No. PCT/JP03/03661, filed on Mar. 25, 2003.

(51) Int. Cl.
*H01L 21/70* (2006.01)
*H01L 21/98* (2006.01)

(52) U.S. Cl. .................................. 438/123; 438/124

(58) Field of Classification Search ................ None
See application file for complete search history.

(56) References Cited

U.S. PATENT DOCUMENTS 4,710,798 A * 12/1987 Marcantonio ............... 257/777

FOREIGN PATENT DOCUMENTS

| JP | 58-157146 | 9/1983 |
|---|---|---|
| JP | 8-293665 | 11/1996 |
| JP | 11-204926 | 7/1999 |
| JP | 2000-332057 | 11/2000 |
| JP | 2001-298046 | 10/2001 |
| JP | 2004-006576 | * 8/2004 |

OTHER PUBLICATIONS

Tadanori Shimoto, et al., "High-Performance Flip-Chip BGA based on Multi-Layer Thin-Film Packaging Technology", Proceedings of the 2002 International Symposium on Microelectronics, Microelectronics and Packaging Society, pp. 10-15.

* cited by examiner

*Primary Examiner*—Zandra Smith
*Assistant Examiner*—Pamela E Perkins
(74) *Attorney, Agent, or Firm*—Fujitsu Patent Center (57) ABSTRACT

A method for manufacturing an electronic component-mounted board (X) includes a temperature raising step for heating an electronic component (30A), with a solder bump electrode (31) containing a solder material, to a first temperature higher than the melting point of the solder material, while also heating a wiring board (X'), with an electrode section (21) corresponding to the solder bump electrode (31), to a second temperature lower than the first temperature. The method further includes a joining step for joining the solder bump electrode (31) and the electrode section (21) by pressing the electronic component (30A) against the wiring board (X'), with the solder bump electrodes (31) and the electrode sections (21) abutting against each other.

4 Claims, 10 Drawing Sheets

METHOD FOR MANUFACTURING ELECTRONIC COMPONENT-MOUNTED BOARD

This application is a continuing application, filed under 35 U.S.C. § 111(a), of International Application PCT/JP2003/003661, filed Mar. 25, 2003, incorporated by reference herein.

TECHNICAL FIELD

The present invention relates to a method for manufacturing an electronic component-mounted board comprising a wiring board and an electronic component that have different thermal expansion coefficients.

BACKGROUND ART

In recent years, the transition to high-density mounting of electronic components assembled in an electronic equipment has been rapidly advanced to meet the demands for improved performance and reduced size of electronic equipment. To comply with the requirements of such a transition to high-density mounting, semiconductor chips are sometimes surface mounted on a wiring board via bumps in a bare chip state, that is, flip-chip mounting is sometimes conducted. As for the wiring boards for mounting the semiconductor chips, following the transition to multi-terminal semiconductor chips, buildup multilayer wiring boards that are advantageous in terms of attaining high-density wiring are sometimes employed. Such semiconductor chips or buildup multilayer wiring boards are described, for example, in Japanese Patent Application Laid-open No. S58-157146 and "High-Performance Flip-Chip BGA Based on Multi-Layer Thin-Film Packaging Technology" (Tadanori SHIMOTO et al., Proceedings of the 2002 International Microelectronics and Packaging Society, pp. 10-15).

With the conventional method for flip-chip mounting a semiconductor chip on a wiring boards, first, a plurality of solder bump electrodes are formed on the prescribed surface of the chip. Meanwhile, a solder paste is printed on the electrode pads for external connection that are present on the wiring boards. Then, the chip is placed on the wiring board so that the solder bump electrodes of the chip are abutted against the solder paste on the electrode pads in the wiring board. Then, the semiconductor chip and wiring board are heated to a temperature equal to or higher than the melting point of the solder material in a reflow furnace, followed by cooling. In the cooling process, the solder material solidifies and the chip and electrode pads are soldered together.

Thermal expansion coefficient in the plane-spread direction in a semiconductor chip composed of a general semiconductor base material is about 3-5 ppm/° C., the thermal expansion coefficient in the plane-spread direction in a typical wiring board employing a glass epoxy substrate as a core board is about 10-20 ppm/° C., and the difference between the two thermal expansion coefficients is comparatively large. Moreover, when the wiring board has a buildup multilayer wiring structure, the thermal expansion coefficient in the plane-spread direction of the buildup multilayer wiring structure is 15-25 ppm/° C. and the difference in thermal expansion coefficient between the buildup multilayer wiring structure and the chip is rather large.

For this reason, after the chip and wiring board pass through the same peak temperature in the flip-chip mounting process and reach a normal temperature, inappropriate warping or waving occurs, in particular, in the wiring board and stresses easily appear in the electric connection portion between the chip and wiring board due to the difference in thermal expansion coefficient between the chip and wiring board. If stresses exceeding the prescribed level appear in the electric connection portion, cracking or peeling easily occurs at the interface of the bump electrodes of the chips and electrode pads of the wiring board in the connection portion. Such an inconvenience tends to be especially significant when a semiconductor chip is flip-chip mounted on a buildup multilayer wiring structure, which has no core board, or when a semiconductor chip is flip-chip mounted on a zone that is not in contact with the core board in the buildup multilayer wiring structure in the wiring board having the buildup multilayer wiring structure.

DISCLOSURE OF THE INVENTION

With the foregoing in view, it is an object of the present invention to provide a method for manufacturing an electronic component-mounted board by adequately mounting an electronic component on a wiring board even when there is a difference in thermal expansion coefficient between the electronic component such as a semiconductor chip and a wiring board.

In accordance with the first aspect of the present invention, there is provided a method for the manufacture of an electronic component-mounted board. This method comprises a temperature raising step for heating an electronic component with a solder bump electrode containing a solder material, and for heating a wiring board provided with an electrode section corresponding to the solder bump electrode, wherein the electrode component is heated to a first temperature that is higher than the melting point of the solder material, while the wiring board is heated to a second temperature that is lower than the first temperature. The method further comprises a joining step for joining the solder bump electrode and the electrode section by abutting the solder bump electrode and the electrode section against each other and pressing the electronic component against the wiring board. The joining step may be carried out after the completion of the temperature raising step or the two steps may be carried out in parallel. When the two steps are carried out in parallel, the electronic component is pressed against the wiring board in a state in which the bump electrodes and electrode sections are abutted against each other, while independently heating the electronic component and wiring board.

The thermal expansion coefficient of electronic component is generally different from that of wiring board, and in most cases the thermal expansion coefficient of the wiring board is higher, as in the case where the electronic component is a semiconductor chip and the wiring board is a buildup multilayer wiring board. With the method of the first aspect of the present invention, the electronic component can be adequately mounted on the wiring board even when the difference in thermal expansion coefficient between the electronic component and wiring board is comparatively high.

In the temperature raising step of the first aspect of the present invention, the electronic component, which is, for example, a semiconductor chip, and the wiring board, which is, for example, a buildup multilayer wiring board, are heated to the prescribed temperature independently. The electronic component and, therefore, solder bump electrodes thereof are heated to the first temperature that is equal to or higher than the melting point of the solder material, thereby providing for temporary melting of the solder material contained in the solder bump electrodes. At this time, the entire wiring board is in a state of expansion corresponding to the first temperature. On the other hand, the wiring board and, therefore, the electrode sections thereof are heated to the second temperature, which is lower than the first temperature. At this time, the entire wiring board is in a state of expansion corresponding to the second temperature. The degree of expansion of the wiring board at the second temperature is lower than the degree of expansion that is supposedly attained when the wiring board is at the first temperature. Therefore, even when the wiring board has a thermal expansion coefficient higher than that of the electronic component, in the temperature raising step, the excess expansion of the wiring board with respect to the electronic component can be inhibited. Furthermore, the wiring board at the second temperature expands from a state in which the wiring board is not heated and is at a normal temperature. The degree of thermal expansion of the wiring board with respect to the electronic component can be adequately adjusted by adequately determining the first temperature and second temperature.

In the joining step carried out after the completion of such a temperature raising step, or in the joining step carried out together with the temperature raising step, the electrode sections of the wiring board and the bump electrodes of the wiring board can be soldered together in a state in which the wiring board is appropriately expanded. Therefore, after cooling to a normal temperature after the soldering process, inappropriate warping or waving of the wiring board is inhibited and stresses in the electric connection portion between the electronic component and wiring board are suppressed. As a result, the occurrence of cracking and peeling in the connection portion can be avoided.

Thus, in accordance with the first aspect of the present invention, the electronic component can be adequately mounted on the wiring board even when there is a comparatively difference in thermal expansion coefficient between the electronic component and wiring board. Therefore, an electronic component-mounted board can be adequately manufactured.

In the first aspect of the present invention, the second temperature is preferably lower than the melting point of the solder material. Such a feature is advantageous for preventing inappropriate expansion of the wiring board.

Preferably, an additional step may be provided for causing ethylene glycol, triethylene glycol, or tetraethylene glycol to adhere to the solder bump electrode prior to the temperature raising step.

Preferably, the wiring board may have a laminated structure comprising a core board and a buildup section. The core board has a through hole for accommodating an electronic component, while the buildup section has a laminated structure comprising a wiring pattern and an insulating layer and has the electrode sections exposed in the through holes. The wiring structure of such a configuration, for example, has a buildup multilayer wiring structure composed of a wiring pattern and an insulating layer. In the joining step, the electronic component is introduced into the through hole of the core board and soldering of the bump electrode and the electrode section is conducted in a state in which the electronic component is present inside the through hole. The surface onto which the electronic component is mounted in the buildup multilayer wiring structure is not directly supported by the core board and can thermally expand easily. With the first aspect of the present invention, the electronic component can be adequately mounted even on such a zone that can thermally expand so easily.

In accordance with the second aspect of the present invention, there is provided another method for the manufacture of an electronic component-mounted board. This method comprises a step of fabricating a wiring board that includes a core board and a buildup section. The core board to be formed has a laminated structure including a core layer and a space layer. The buildup section is to be formed on the space layer to have a laminated structure including a wiring pattern and an insulating layer. The buildup section is provided with an electrode section to be held in contact with the spacer layer. The method also comprises: a step of removing a part of the core layer that corresponds to the electrode section by conducting etching of the core layer from a side opposite to the buildup section; a step of conducting etching of the spacer layer from a side opposite to the buildup section in order to expose the electrode section and also to leave a spacer on an electrode component mounting surface of the buildup section; and a step of mounting an electronic component having a bump electrode on the wiring board by joining the bump electrode and the electrode section, with the spacer interposed between the electronic component and the buildup section.

With this method, an electronic component-mounted substrate having the prescribed electronic component accommodated in a core board can be adequately manufactured. The wiring board obtained in accordance with the second aspect of the present invention comprises a core board that includes a core layer and a spacer layer and a buildup section joined to the spacer layer. Through holes facing the electrode sections of the buildup section are formed in the core board by a plurality of etching operations carried out form the side opposite to the buildup section. The core layer and spacer layer in the core board and other layers, when such are present, are etched by appropriate etching. In the etching treatment of the spacer layer, the electrode section of the buildup section is exposed and the spacer is formed by leaving it unetched. In the joining step of the electronic component, the electronic component and wiring board are heated, the electronic component is pressed against the buildup section, and the bump electrode and electrode section are soldered in a state in which the electronic component is present in the through hole of the core board. At this time, because the spacer that is formed heretofore is introduced between the electronic component and buildup section, the electronic component and buildup section are prevented from being brought too close to each other. The height of the spacer from the buildup section, that is, the height of the spacer layer is determined according to the size of the bump electrode of the electronic component. Therefore, in the soldering process, the bump electrodes that pass through a melting stage are prevented from being subjected to the action of an inappropriate load and the electronic component can be adequately mounted on the wiring board.

If an electronic component is further mounted on the exposed surface on the side opposite to the core board in the buildup section, that is, the buildup multilayer wiring structure of the electronic component-mounted board that is thus obtained, the wiring resistance between the two electronic components can be reduced when the additional electronic component is electrically connected to the electronic component located in the through hole. This is because the wiring length between the two electronic components can be designed shorter via the buildup multilayer wiring structure. For example, when the electronic component located in the through hole is an IC chip and the additional electronic component is a capacitor chip, signal noise between the two chips can be substantially suppressed by the reduction of wiring resistance between the two chips.

In accordance with the second aspect of the present invention, the core board preferably has a laminated structure in which an intermediate layer is introduced between the core layer and spacer layer. In this case, it is preferred that the core layer and spacer layer be from a metal material and the interlayer be from a resin material. With such a configuration, the two adjacent layers of the core board have substantially different etching characteristics. Therefore, such a configuration is advantageous in terms of adequately conducting a plurality of etching operations on the core board. More specifically, it is advantageous for opening a through hole for accommodating an electronic component in the core board, while leaving a spacer in the spacer layer.

Preferably, the bump electrode may contain a solder material and that in the mounting step, the electronic component be heated to a first temperature that is higher than the melting point of the solder material, the wiring board be heated to a second temperature that is lower than the first temperature, and the electronic component be pressed against the wiring board, while abutting the bump electrodes and electrode sections against each other. With such a configuration, based on the reason identical to that described hereinabove with reference to the first aspect of the present invention, the electronic component can be adequately mounted on the buildup section of the wiring boards. Therefore, an electronic component-mounted board can be adequately manufactured.

BEST MODE FOR CARRYING OUT THE INVENTION

Figure 1A:
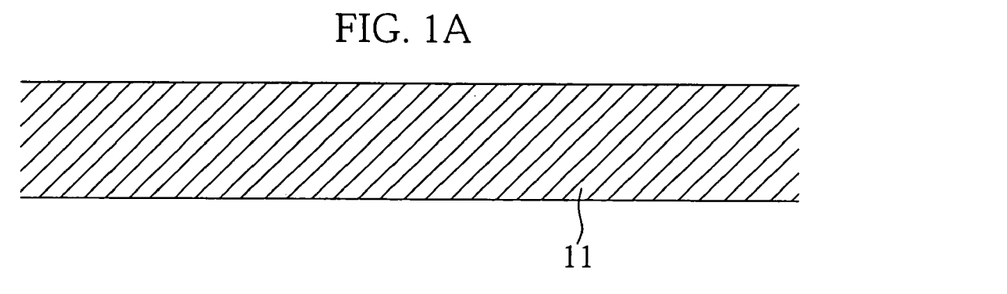
FIGS. 1A to 1D illustrate part of the process in the method for the manufacture of a chip-mounted board in accordance with the present invention.

In the manufacture of the chip-mounted board X in accordance with the present invention, first, a core material 11 shown in FIG. 1A is prepared. The core material is a metal substrate and comprises a single metal selected from the group including tungsten, molybdenum, zirconium, chromium, and tantalum or an alloy comprising metal selected from this group. Alternatively, the core material 11 is a 42 Alloy, stainless steel, Kovar, Invar, or a clad material having a copper/Invar/copper laminated configuration. The thermal expansion coefficient in the plane-spread direction in the core material 11 is preferably close to the thermal expansion coefficient of the electronic component, such as a semiconductor chip, that will be mounted and is, for example, 2-10 ppm/° C. Further, the thickness of the core material 11 is, for example, 0.1-2.0 mm.

Figure 1B:
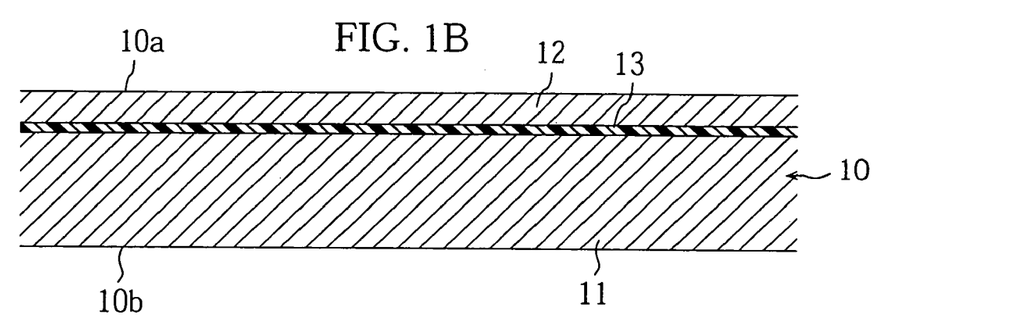

Then, as shown in FIG. 1B, a spacer material 12 is pasted onto the core material 11 via an adhesive. The adhesive is cured between the core material 11 and spacer material 12 and forms an intermediate layer 13. A core board 10 comprising the core material 11, intermediate layer 13, and spacer material 12 and having a first surface 10a and a second surface 10b is thus fabricated. The spacer material 12 is a metal sheet or foil and comprises, for example, copper, nickel, or aluminum. The thickness of the spacer material 12 is, for example, 30-100 μm. The intermediate layer 13 comprises a thermosetting resin material comprising, for example, an epoxy resin as the main component. The thickness of the intermediate layer 13 is, for example, 10-30 μm. The thermal expansion coefficient in the plane-spread direction of the core board 10 is controlled by the thermal expansion coefficient of the core material 11 in the plane-spread direction.

Figure 1C:
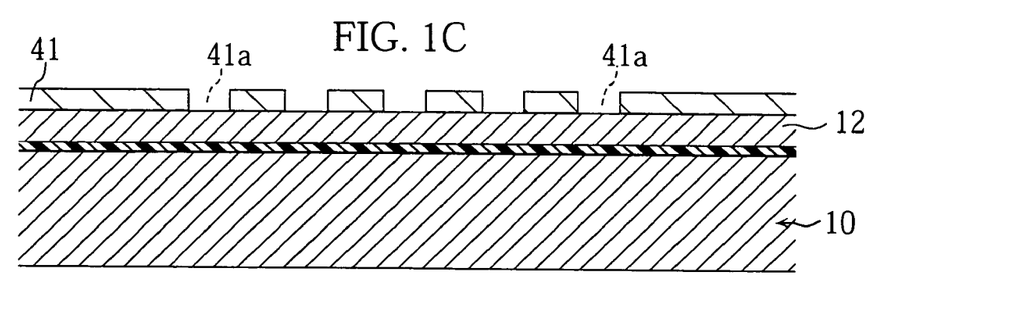

In the manufacture of the chip-mounted board X in accordance with the present invention, then, a resist pattern 41 is formed on the spacer material 12, as shown in FIG. 1C. The resist pattern 41 has an opening 41a corresponding to the shape of the electrode pad that will be formed in the next process. In the formation of the resist pattern 41, first, a film-like photosensitive photoresist is laminated on the spacer material 12. Then, the opening 41a is formed in the photoresist film via exposure and development of the photoresist film. Thus, the resist pattern 41 can be formed.

Figure 1D:
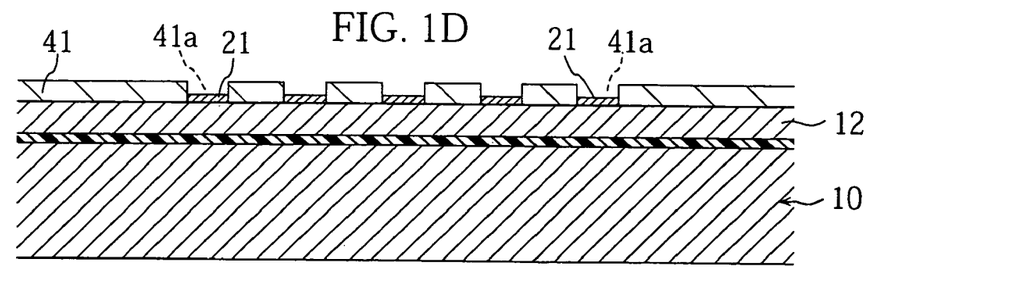

In the manufacture of the chip-mounted board X, an electrode pad 21 is then formed, as shown in FIG. 1D. The electrode pad 21 is formed by depositing the prescribed electrically conductive material inside the opening 41a by an electroplating process carried out by using the spacer material 12 as an electrically conductive layer. For example, the electrode pad 21 can be formed by successively depositing Ni, Au, Ni, and Cu inside the opening 41a. Alternatively, the electrode pad 21 may be formed by successively depositing Au, Ni, and Cu. In this case, a Ni plated film is formed in advance on the exposed surface of the spacer material 11 by an electroplating process prior to the process of forming the resist pattern 41 described hereinabove with reference to FIG. 1C. The Ni plated film representing the lowermost layer in the formation of the electrode pad 21 or the Ni plated film formed prior to the formation of the resist pattern 41 functions as a barrier layer preventing metal materials from diffusing between the spacer material 12 and the Au plated film of the electrode pad 21. The Ni plated film located between the Au plated film and Cu plated film in the electrode pad 21 functions as a barrier layer preventing metal materials (Au, Cu) from diffusing between the Au plated film and Cu plated film.

Figure 2A:
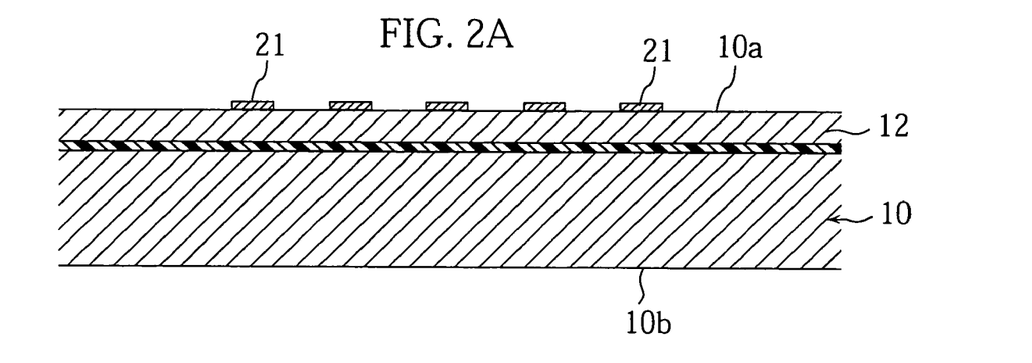
FIGS. 2A to 2C represent the process following the process shown in FIG. 1D.

Then, as shown in FIG. 2A, the resist pattern 41 is removed from the core board 10. In the removal process, a stripping solution corresponding to the composition of the resist pattern 41 is used.

Figure 2B:
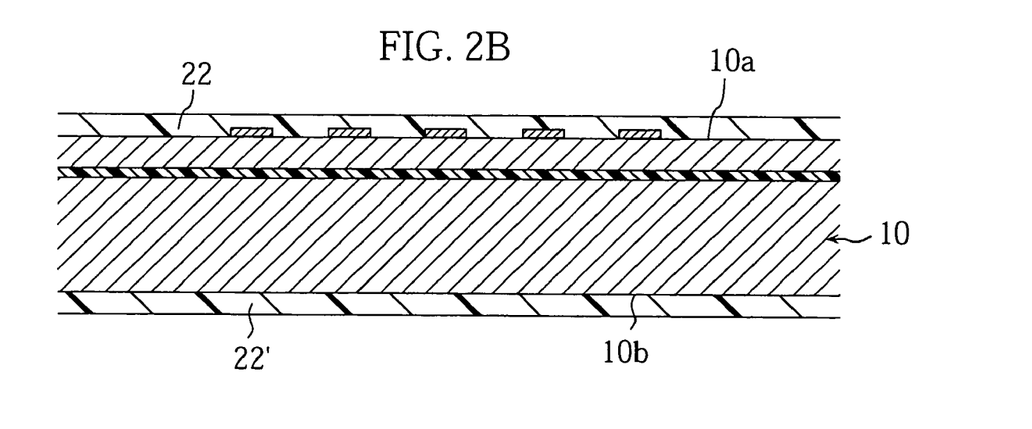

Then, as shown in FIG. 2B, an insulating layer 22 is lamination formed on the first surface 10a of the core board 10 and an insulating layer 22' is lamination formed on the second surface 10b. In the formation of the insulating layer 22, a film-like resin composition is press bonded to the core board 10 under heating. Alternatively, a liquid resin composition is coated on the core board by a spin coat process, followed by drying. The formation method of the insulating layer 22' is identical to the formation method of the insulating layer 22. Examples of suitable materials constituting the insulating layers 22, 22' include epoxy, polysulfones, polyethersulfones, polyphenylsulfones, polyphthalamides, polyamidoimides, polyketones, polyacetals, polyimides, polycarbonates, modified polyphenylene ethers, polyphenylene oxides, polybutylene terephthalate, polyacrylates, polysulfones, polyphenylene sulfide, polyether ether ketone, tetrafluoroethylene, cyanate esters, and bismaleimide.

Figure 2C:
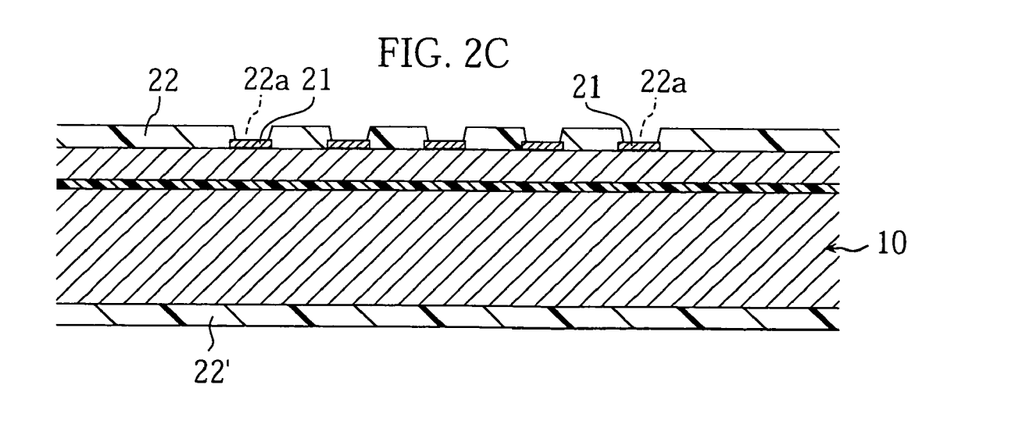

Then, as shown in FIG. 2C, a via hole 22a is locally formed in the insulating layer 22 in the location corresponding to the electrode pad 21. The via hole 22a can be formed, for example, with an UV-YAG laser, $CO_2$ layer, excimer laser, or by dry etching using plasma. Alternatively, when the insulating layer 22 is photosensitive, the via hole 22a can be formed by photolithography.

Figure 3A:
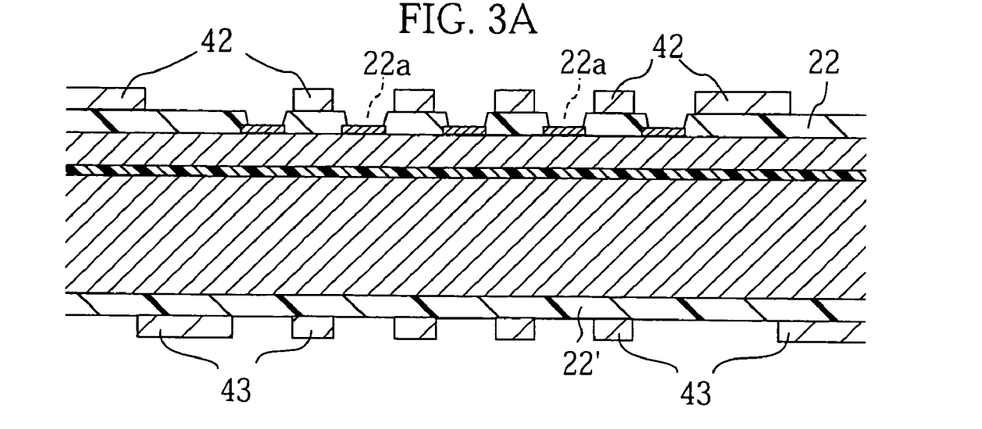
FIGS. 3A to 3C represent the process following the process shown in FIG. 2C.

A seed layer (not shown in the figure) is then formed by depositing the prescribed metal material on the exposed surface of the insulating layers 22, 22' by an electroless plating method, and then, as shown in FIG. 3A, a resist pattern 42 is lamination formed on the insulating layer 22 and a resist pattern 43 is lamination formed on the insulating layer 22'. The seed layer will be used as an electrically conductive layer in the electroplating process that will be subsequently conducted and is also formed on the inner wall of the via hole 22a. The seed layer is, for example, a plated copper layer. The resist patterns 42, 43 have the prescribed pattern shape corresponding to the wiring pattern that will be formed on the insulating layers 22, 22', respectively. The formation methods of the resist patterns 42, 43 are identical to the formation method of the resist pattern 41.

Figure 3B:
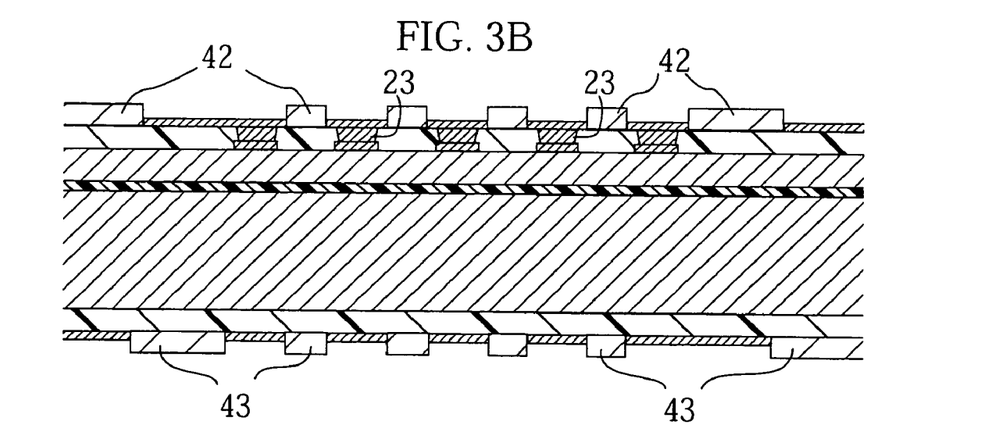

Then, as shown in FIG. 3B, copper is deposited on the seed layer (not shown in the figure), which has been formed before, by an electroplating method using the resist patterns 42, 43 as masks. As a result, a copper via contact 23 is formed in the via hole 22a and an electroplated copper film is formed in the positions of the insulating layers 22, 22' that were not masked by the resist patterns 42, 43.

Figure 3C:
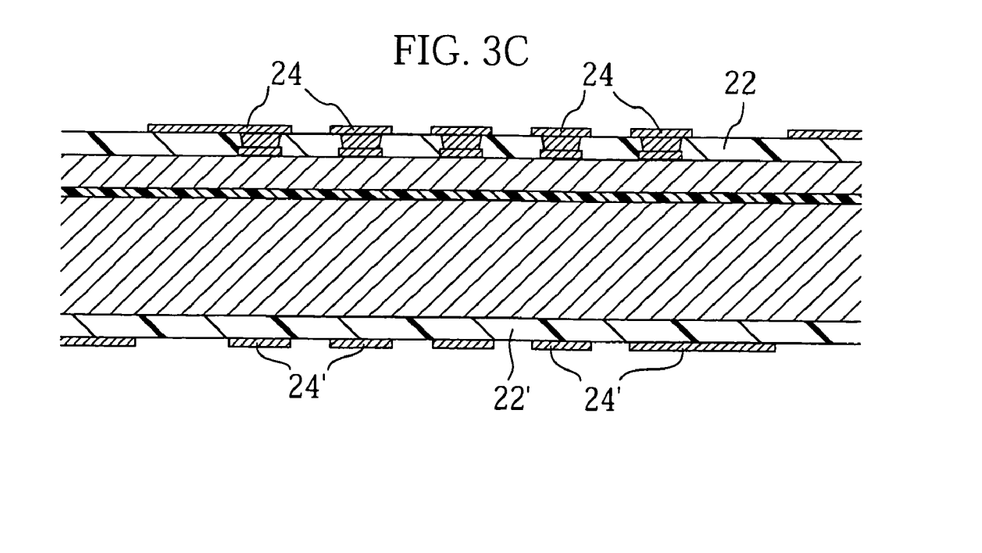

Then, as shown in FIG. 3C, the resist patterns 42, 43 are stripped. The seed layer (not shown in the figure) that has not been covered by the electroplated copper film is then etched out. As a result, a wiring pattern 24 is formed on the insulating layer 22 and a wiring pattern 24' is formed on the insulating layer 22'.

Figure 4A:
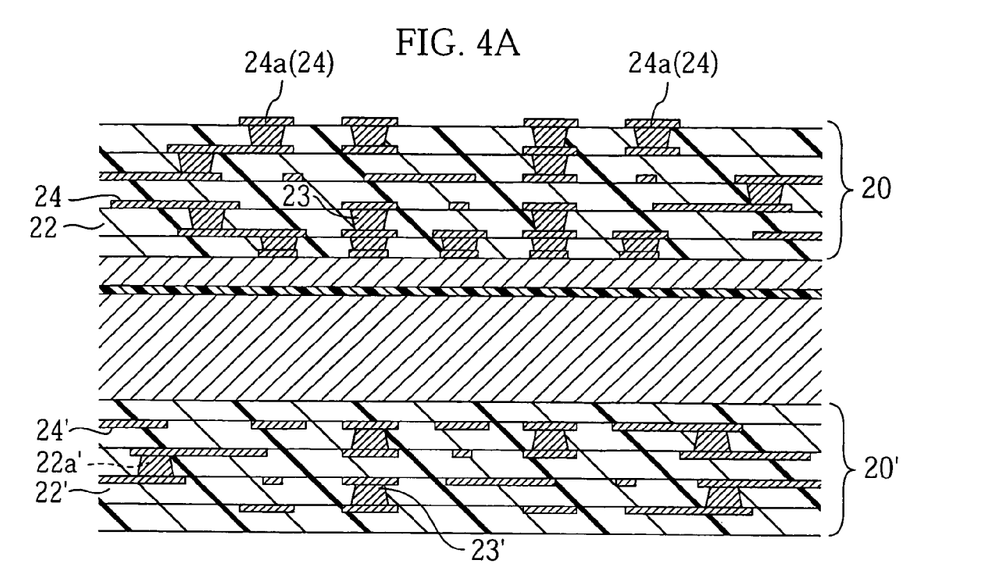
FIGS. 4A to 4B represent the process following the process shown in FIG. 3C.

In the manufacture of the chip-mounted board X, the sequence of processes comprising the formation of the insulating layer 22, formation of the via hole 22a, and then formation of the via contact 23 and wiring pattern 24 by the above-described buildup process is repeated the prescribed number of times on the side of the first surface 10a of the core board 10, and the sequence of processes comprising the formation of the insulating layer 22', formation of the via hole 22a', and then formation of the via contact 23' and wiring pattern 24' by the build-up process is repeated the same number of times on the side of the second surface 10b, thereby forming the buildup sections 20, 20' shown in FIG. 4A. The formation methods of the via hole 22a' and via contact 23' are identical to the formation methods of the via hole 22a and via contact 23. In the present embodiment, the number of stacked wiring patterns 24 is five, and an electrode pad 24a for external connection is provided on the outermost wiring pattern 24.

Figure 4B:
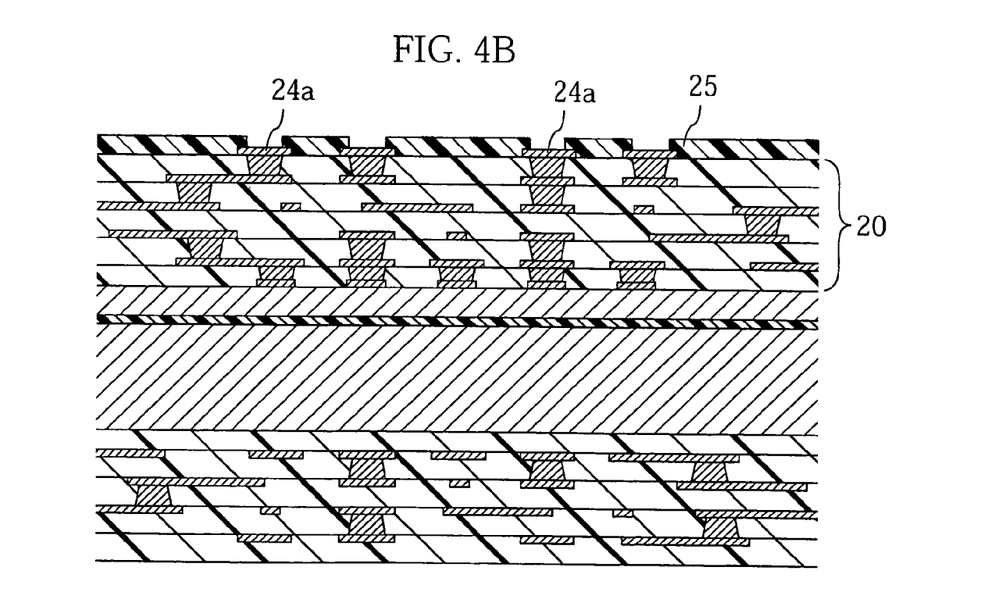

Then, as shown in FIG. 4B, an overcoat layer 25 is formed on the surface of the buildup section 20. The overcoat layer 25 is opened correspondingly to the electrode pad 24a. In the formation of the overcoat layer 25, first, a photosensitive resin for the overcoat layer is formed on the buildup section 20 by printing technology. Then, the prescribed opening is formed by photolithography. After the overcoat layer 25 has been formed, for example, a Ni plated film and a Au plated film thereon may be formed by an electroless plating process on the exposed surface of the electrode pad 24a.

Figure 5A:
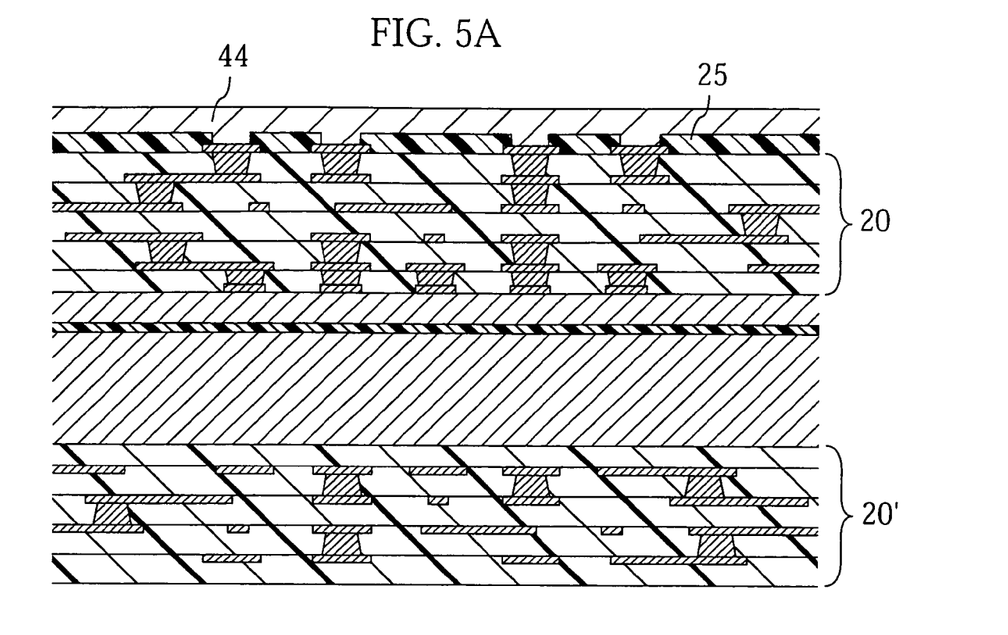
FIGS. 5A to 5B represent the process following the process shown in FIG. 4B.

In the manufacture of the chip-mounted board X, then, as shown in FIG. 5A, the buildup section 20 provided with the overcoat layer 25 is covered with a protective film 44. The protective film 44 is, for example, from a dry film resist.

Figure 5B:
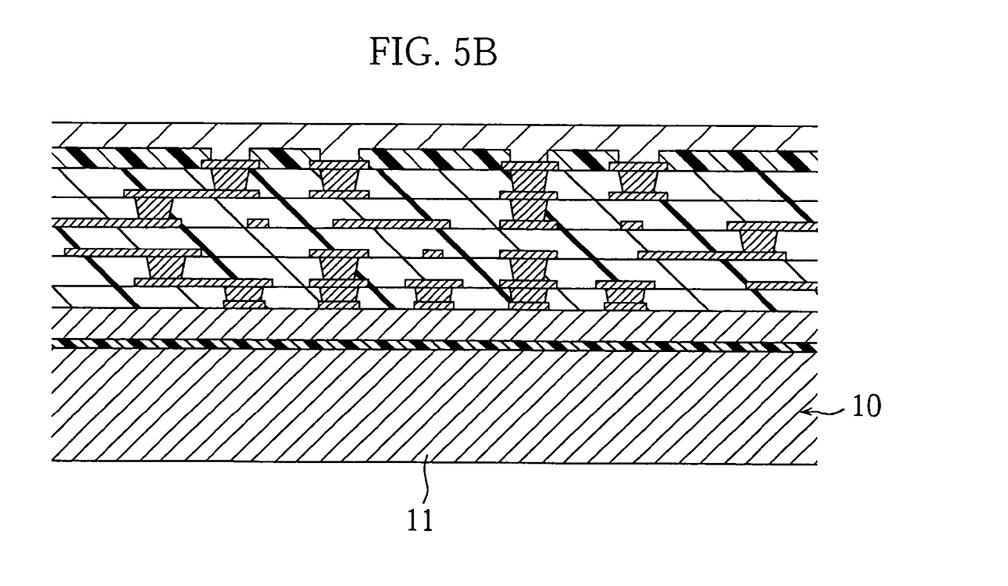

Then, as shown in FIG. 5B, the buildup section 20' is removed, for example, by mechanical processing such as polishing. As a result, the core material 11 of the core board 10 is exposed. In accordance with the present invention, alternatively, only a zone corresponding to the subsequent chip mounting area may be removed from the buildup section 20' by NC cutting or laser machining.

Figure 6A:
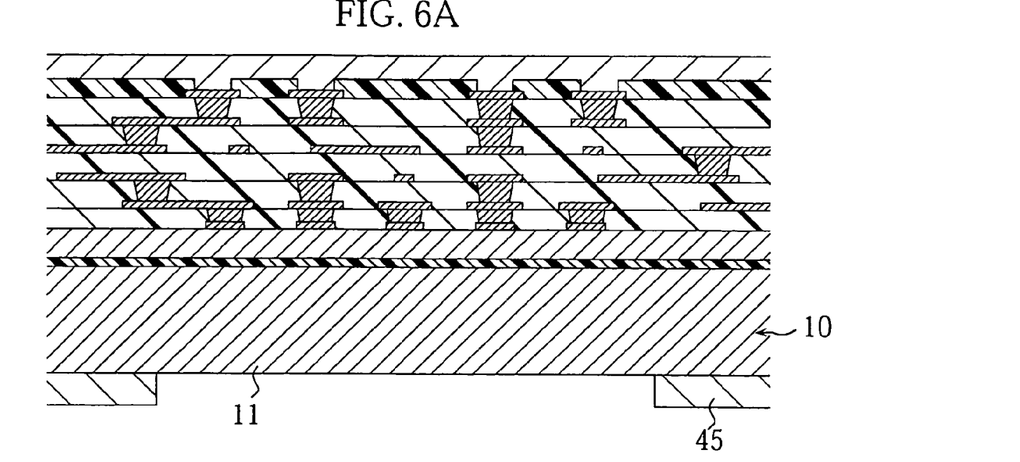
FIGS. 6A to 6C represent the process following the process shown in FIG. 5B.

Then, as shown in FIG. 6A, a resist pattern 45 is formed on the core material 11 of the core board 10. The resist pattern 45 has an opening in the location corresponding to the electrode pad 21. The formation method of the resist pattern 45 is identical to the formation method of the resist pattern 41.

Figure 6B:
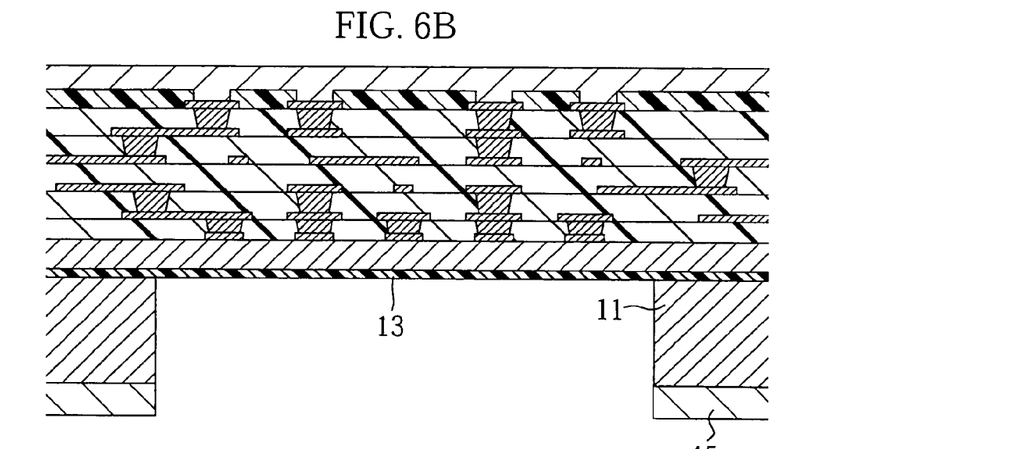

Then, as shown in FIG. 6B, etching is conducted, by using the resist pattern 45 as a mask, with respect to the core material 11 till the intermediate layer 13 is exposed. In this process, for example, an aqueous solution of ferric chloride, hydrofluoric acid, or aqua regia can be used, correspondingly to the materials constituting the core material 11, as the etching liquid. After the etching, the resist pattern 45 is stripped.

Figure 6C:
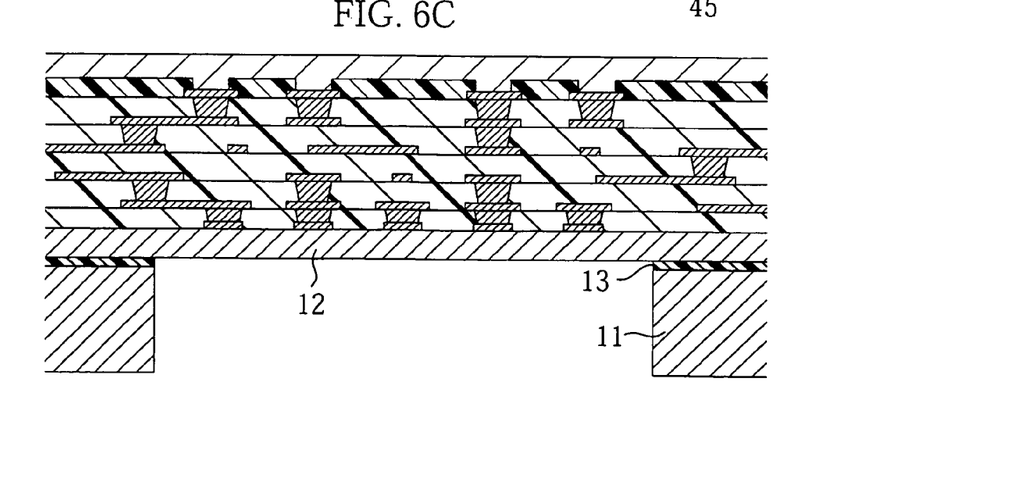

Then, as shown in FIG. 6C, etching is conducted, by using the core material 11 as a mask, with respect to the intermediate layer 13 till the spacer material 12 is exposed. This process is carried out by dry etching. For example, reactive ion etching (RIE) or ion milling can be used as the dry etching.

Figure 7A:
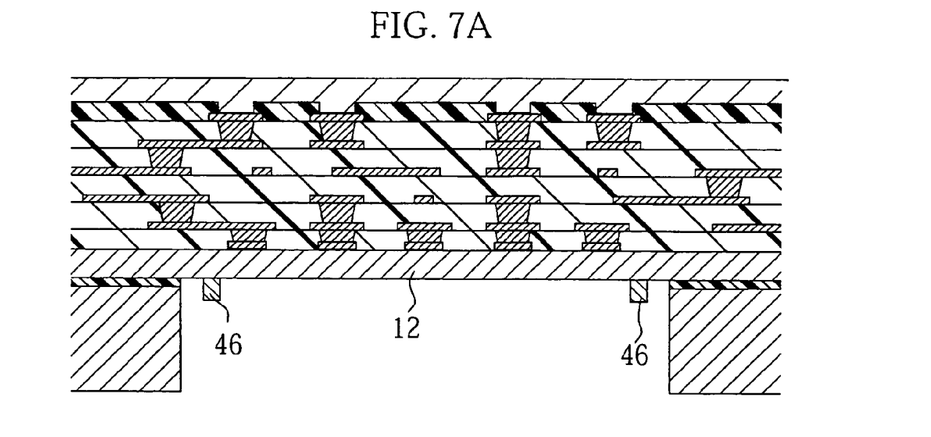
FIGS. 7A to 7C represent the process following the process shown in FIG. 6C.

Then, as shown in FIG. 7A, a resist pattern 46 is formed on the spacer material 12. The resist pattern 46 serves to mask the locations where subsequent spacers will be formed in the spacer material 12. In the formation of the resist pattern 46, first, an ink-type (liquid) photoresist having photosensitivity is coated on the exposed surface of the spacer material 12, followed by drying, for example, for 30 min at a temperature of 80° C. Then, the prescribed pattern is formed in the photoresist film by exposing and developing the photoresist film. The resist pattern 46 can thus be formed.

Figure 7B:
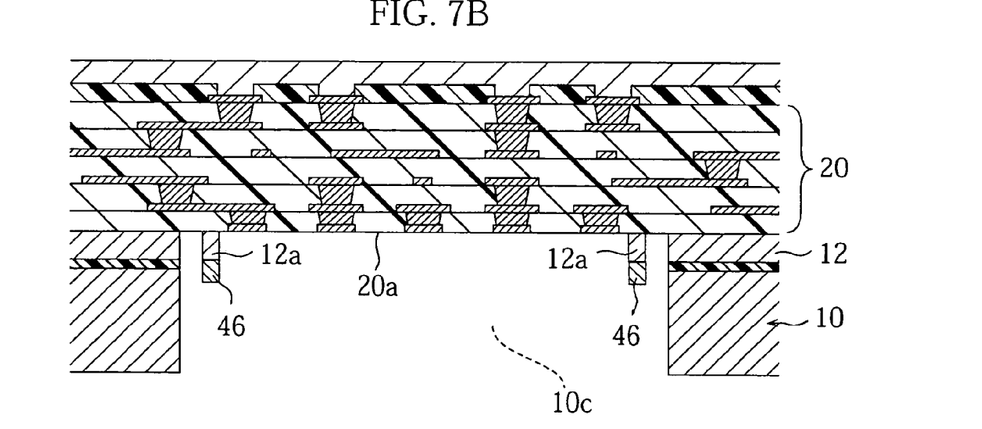
Figure 7C:
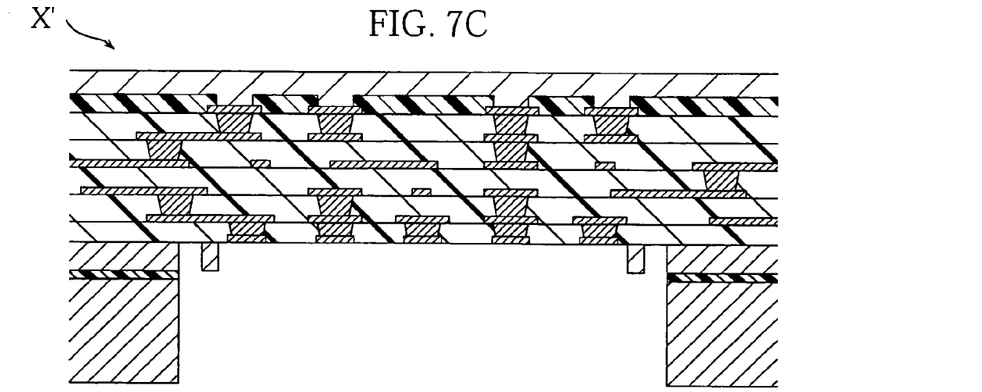

Then, as shown in FIG. 7B, etching is conducted, by using the resist pattern 46 as a mask, with respect to the spacer material 12 till the electrode pad 21 is sufficiently exposed. As a result, a through hole 10c for chip accommodation is formed in the core board 10, and a chip mounting area 20a in the buildup section 20 is exposed. At the same time, a spacer 12a is formed on the chip mounting area 20a. In this process, for example, an aqueous solution of copper chloride can be used as the etching liquid correspondingly to the material constituting the spacer material 12. Then, as shown in FIG. 7C, the resist pattern 46 is stripped. The board is then split to individual pieces, that is, to the package size. The wiring board X' is thus formed.

Figure 8A:
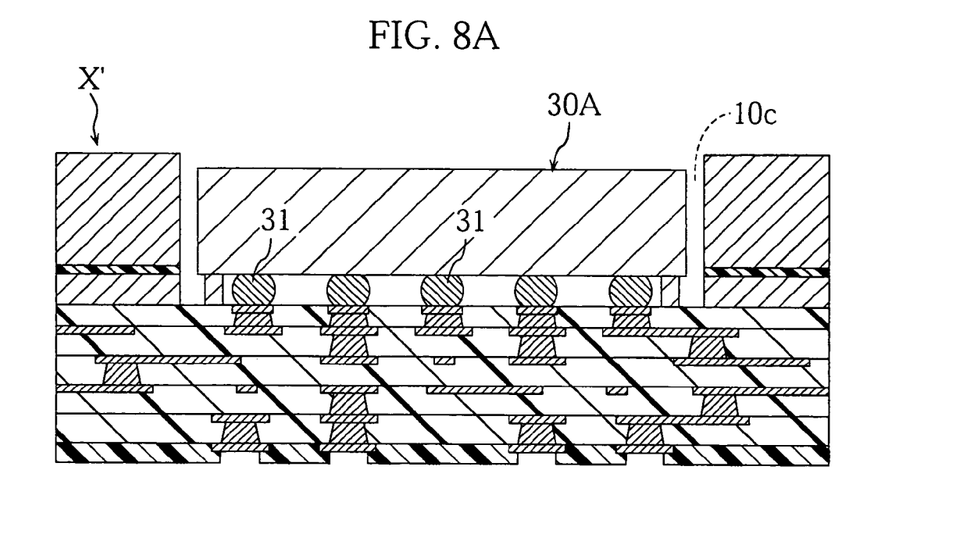
FIGS. 8A to 8B represent the process following the process shown in FIG. 7C.

Then, as shown in FIG. 8A, a semiconductor chip 30A having a bump electrode 31 for external connection is mounted on the wiring board X'. Thus, the semiconductor chip 30A is flip chip mounted on the wiring board X'. The entire bump electrode 31 is composed of a solder material. Alternatively, the bump electrode 31 is composed of a core ball, for example, of copper and a solder material covering the core ball.

Figure 9A:
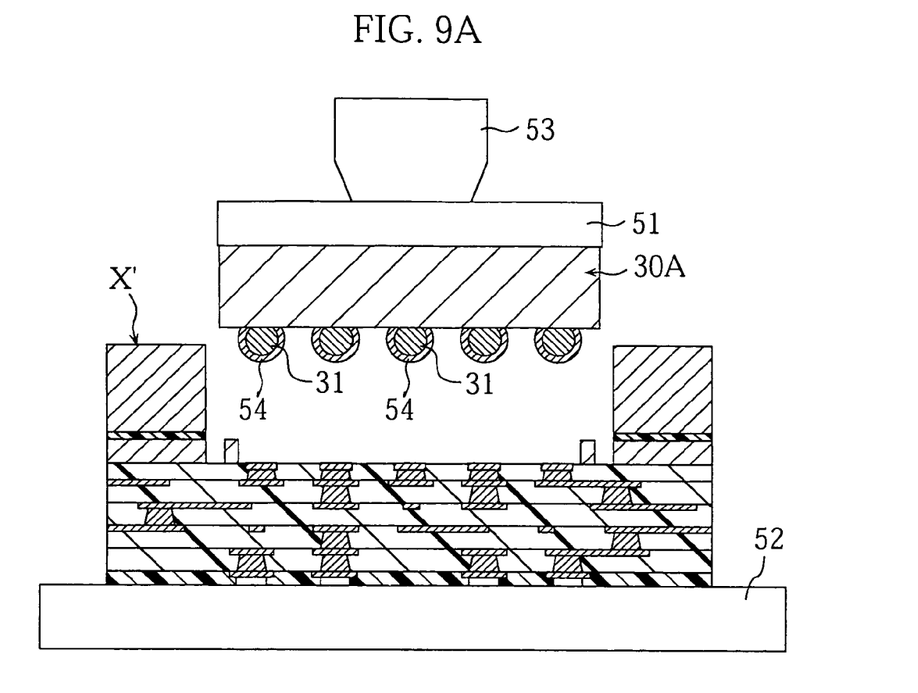
FIGS. 9A and 9B represent a step in which a chip Is mounted on a wiring board.

In the chip mounting process, first, as shown in FIG. 9A, the semiconductor chip 30A is fixed to a heat plate 51 and the wiring board X' is fixed to a heat plate 52. Then, the heat plate 51 is suction attached with a suction collet 53 and the semiconductor chip 30A is positioned with respect to the wiring board X' by opening the section collet 53. The heat plate 51 has a temperature-adjustable heat generation function, and the semiconductor chip 30A is heated to the first temperature with the heat plate 51. The first temperature is higher than the melting point of the solder material contained in the bump electrode 31. The heat plate 52 has a temperature-adjustable heat generation function, and the wiring board X' is heated to a second temperature with the heat plate 52. The second temperature is lower than the first temperature and lower than the melting point of the solder material contained in the bump electrode 31. Furthermore, an oxidation-preventing agent 54 is coated in advance on the bump electrode 31 of the semiconductor chip 30A prior to heating the semiconductor chip 30A with the heat plate 51. Ethylene glycol, triethylene glycol, or tetraethylene glycol can be used as the oxidation-preventing agent 54.

Figure 9B:
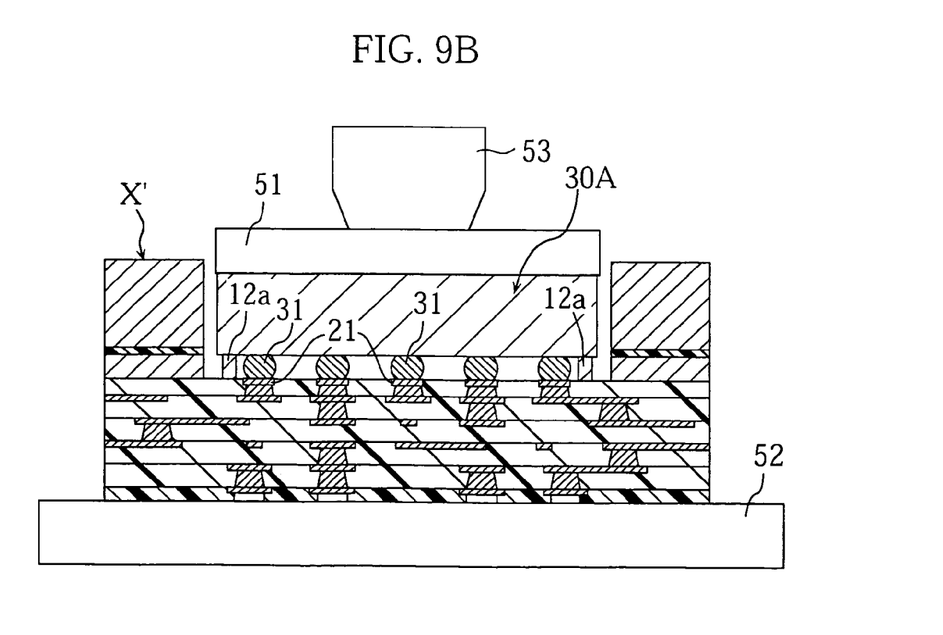

In the chip mounting process, then, as shown in FIG. 9B, the semiconductor chip 30A is pressed against the wiring board X', in a state in which the bump electrode 31 and electrode pad 21 are abutted against each other, by operating the suction collet 53. In the pressed state, the semiconductor chip 30A and bump electrode are temperature adjusted so as to pass through the first temperature. As a result, the solder material of the bump electrode 31 passes through a temporary molten state. Therefore, the bump electrode 31 and electrode pad 21 that passed through this process are soldered together. During soldering, the oxidation-preventing agent 54 that adhered to the bump electrode 31 is evaporated.

In such a chip mounting process, the semiconductor chip 30A and wiring board X' are heated individually. The semiconductor chip 30A and, therefore, the bump electrodes 31 thereof are heated to the first temperature that is equal to or higher than the melting point of the solder material, thereby necessarily providing for temporary melting of the solder material contained in the bump electrode 31. At this time, the entire semiconductor chip 30A is in the expansion state corresponding to the first temperature. On the other hand, the wiring board X' and, therefore, the electrode pad 21 thereof are heated to the second temperature that is lower than the first temperature. At this time, the entire wiring board X' is in the expansion state corresponding to the second temperature. Therefore, in the process of raising the temperature of the semiconductor chip 30A and wiring board X', the wiring board X' can be prevented from excessively expanding with respect to the semiconductor chip 30A.

When the bump electrode 31 and electrode pad 21 are joined in the chip mounting process, soldering can be conducted in a state in which the wiring board X' is thus appropriately expanded. Therefore, in cooling to the normal temperature after the soldering, inappropriate warping or waving in the wiring board X' can be prevented and stresses that can appear in the electric connection portion composed of the bump electrode 31 and electrode pad 21 between the semiconductor chip 30A and wiring board X' can be inhibited. As a result, the occurrence of cracking or peeling in the connection portion can be avoided and a highly reliable connection can be obtained between the semiconductor chip 30A and wiring board X'.

Further, in the chip mounting process, because the spacer 12a is introduced between the semiconductor chip 30A and buildup section 20, the semiconductor chip 30A and buildup section 20 are prevented from being brought too close to each other. The height of the spacer 12a from the buildup section 20, that is, the thickness of the pacer layer 12, is determined correspondingly to the size of the bump electrode 31 of the semiconductor chip 30A. Therefore, an inappropriate load is prevented from acting upon the bump electrode 31 that passes through the molten state in the soldering process and the semiconductor chip 30A is adequately mounted on the wiring board X'.

Figure 8B:
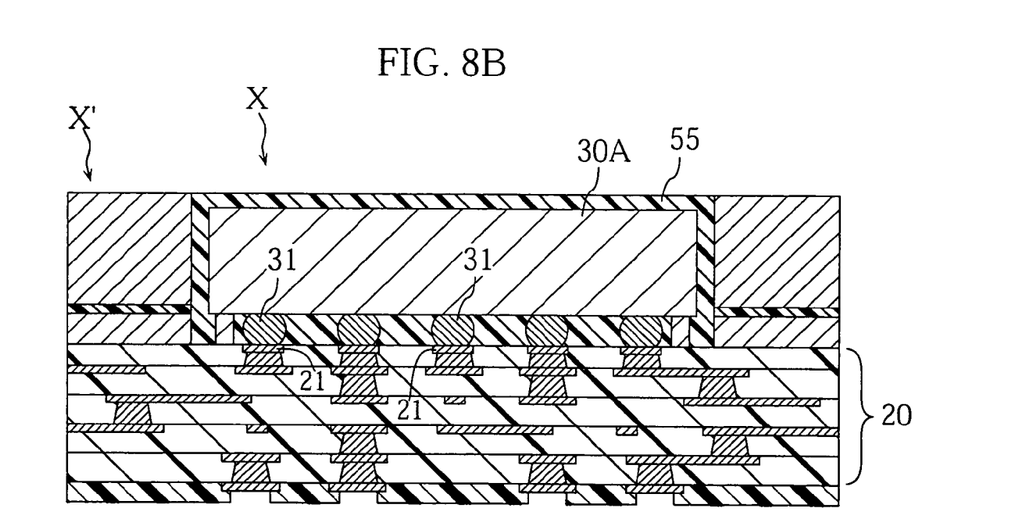

In the manufacture of the chip-mounted board X, then, as shown in FIG. 8, the through hole 10C in the core board 10 is filled with an underfill agent 55. The underfill agent 55 fills the space between the semiconductor chip 30A and buildup section 20 and seals the semiconductor chip 30A. The underfill agent 55 has a function of relaxing the stresses that can occur in the electric connection portion composed of the bump electrode 31 and electrode pad 21. This stress relaxation function ensures connection reliability in the above-described flip-chip mounting.

The chip-mounted board X composed of the wiring board X' and semiconductor chip 30A is thus manufactured.

Figure 10:
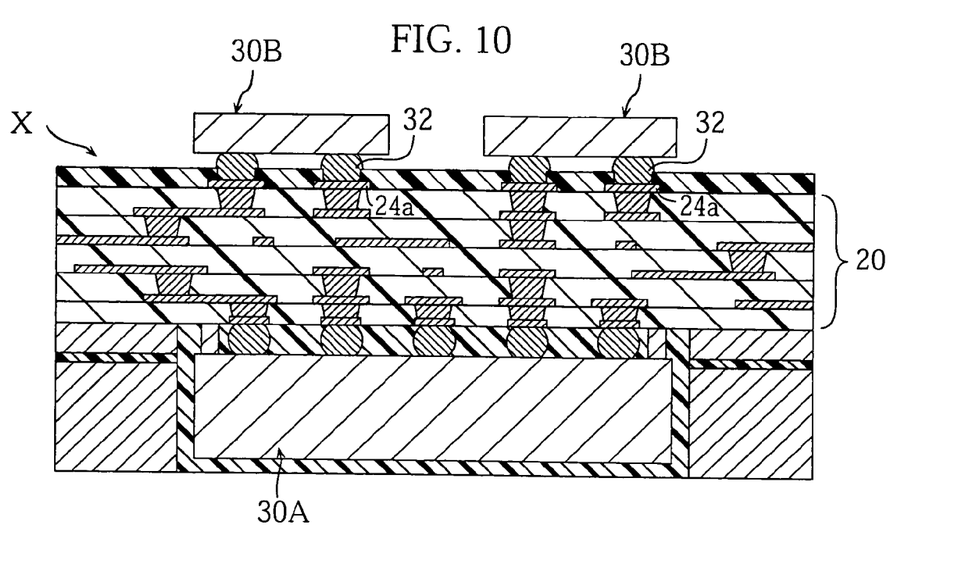
FIG. 10 illustrates a state in which yet another electronic component is mounted on the chip-mounted board in accordance with the present invention.

As shown in FIG. 10, a semiconductor chip 30B is mounted on the chip-mounted board X. The semiconductor chip 30B has a bump electrode 32 for external connection. The entire bump electrode 32 is composed of a bump material. Alternatively, the bump electrode 32 is composed of a core bail, for example, of copper and a solder material covering the core ball. The semiconductor chip 30B can be mounted on the chip-mounted substrate X by the method identical to the above-described method for mounting the semiconductor chip 30A. In the mounted state the bump electrode 32 and electrode pad 24a are melt joined or soldered together.

If the semiconductor chip 30B is thus mounted on the chip-mounted substrate X, when the semiconductor chip 30B and semiconductor chip 30A are electrically connected, the wiring resistance between the two chips can be reduced. This is because the wiring length between the two chips can be designed to be short via the fine wiring structure of the buildup section 20. For example, when the semiconductor chip 30A is an IC chip and the semiconductor chip 30B is a capacitor chip, the reduction of wiring resistance between the two chips makes it possible to suppress sufficiently the signal noise between the two chips.

Figure 11:
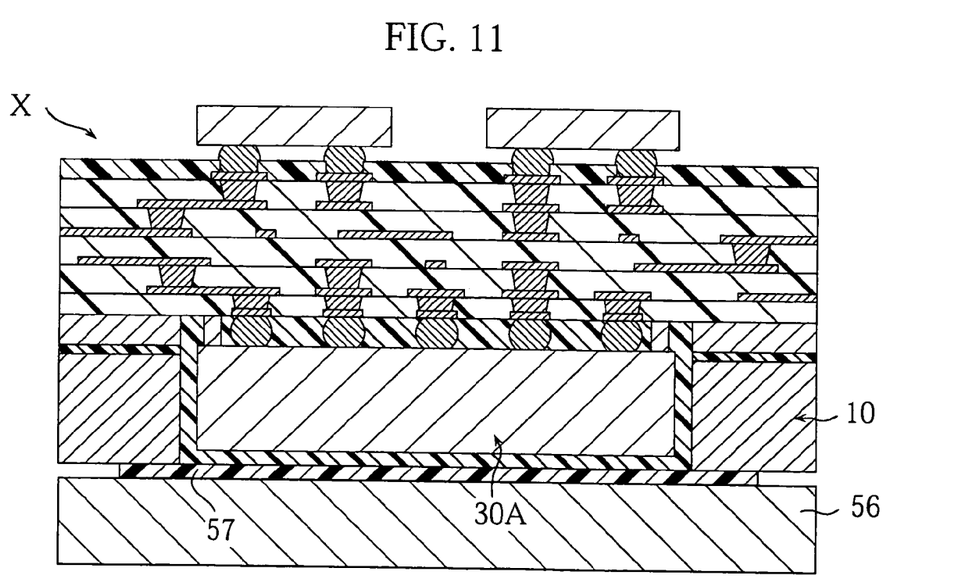
FIG. 11 illustrates a state where the chip-mounted board in accordance with the present invention comprises a heat sink.

A heat sink 56 may be attached to the chip-mounted board X, as shown in FIG. 11. The heat sink 56 serves to dissipate heat generated by the semiconductor chip 30A and is joined to the core board 10 and the semiconductor chip 30A via the prescribed adhesive 57. The configuration in which the chip-mounted board X is equipped with the heat sink 56 is especially advantageous when the semiconductor chip 30A is an IC chip. IC chips tend to generate a large quantity of heat when they are driven.

In the present embodiment, the entire buildup section 20' is removed by mechanical polishing as a dummy buildup section before the core material 11 is subjected to etching. Alternatively, in accordance with the present invention, part of the buildup section 20' may be left on the core board 10 and the wiring structure contained in the remaining section may be used as part of the wiring structure of the chip-mounted board X that is to be formed. In this case, in the process explained hereinabove with reference to FIG. 5B, only the portion equivalent to the chip mounting area 20a is removed, without removing the entire buildup section 20'. For example, NC cutting or laser processing can be employed as methods for particle removal of the buildup section 20'.

EXAMPLES

In the fabrication of the chip-mounted board of the present working example, first, a core board was fabricated. In the fabrication of the core board, an electrolytic copper foil (thickness 70 μm), which was a spacer material, was pasted on a 42 Alloy sheet (plane size 150 mm×150 mm, thickness 0.5 mm) that served as a core material via an epoxy resin sheet (trade name ABF, manufactured by Ajinomoto Fine Techno Co., Ltd.) serving as an adhesive constituting an intermediate layer. The 42 Alloy has a Fe-42 wt % Ni composition.

In the fabrication of the chip-mounted board, then, a Ni plated film was formed on the electrolytic copper foil by an electroplating method. Then, a resist pattern was formed on the electrolytic copper foil via the Ni plated film. This resist pattern had a plurality of openings corresponding to the shape of electrode pads that are to be formed in the next step. In the formation of the resist pattern, first, a dry film resist (trade name NIT-240, manufactured by Nichigo Morton Co.) having photosensitive properties was pasted on the electrolytic copper foil. The openings were formed in the photoresist film by subjecting the photoresist film to exposure and development.

In the manufacture of the chip-mounted board, then, electrode pads were formed in all the openings of the resist pattern. More specifically, electrode pads were formed by successively forming a Au plated film (thickness 1 µm), a Ni plated film (thickness 5 µm), and a Cu plated film (thickness 15 µm) inside the openings by an electroplating method. After the electrode pads have been formed, the resist pattern was stripped from the electrolytic copper foil by treating it with a 3 wt % aqueous solution of sodium hydroxide as a stripping solution. In the core board, the surface on the side where the electrode pad was formed was taken as the first surface and the surface on the side opposite the first surface was taken as the second surface.

Then, insulating layers were formed on both surfaces of the core boards. More specifically, first, epoxy resin sheets (plane size 200 mm×200 mm, thickness 50 µm, trade name ABF, manufactured by Ajinomoto Fine Techno Co., Ltd.) were press bonded by using a vacuum laminator. The press bonding temperature was 130° C. and the press bonding time was 2 min. The epoxy resin was then cured by heating for 30 min at a temperature of 170° C.

A plurality of via holes (diameter 60 µm) were then formed by a $CO_2$ laser in locations on the insulating layer on the first surface side corresponding to the above-described electrode pads so as to expose portions of the electrode pads.

Then, copper wiring patterns were formed on the insulating layers on both surfaces by a semi-additive method. At this time, via contacts were also formed in the via holes by depositing copper on the surface of the via holes in the insulating layer on the first surface side. More specifically, first, the surfaces of the insulating layers and the surfaces of via holes were subjected to de-smearing treatment and then electroless plated copper films were formed on the surface of the insulating layers and via holes. The de-smearing treatment was conducted by using an aqueous solution containing a permanganate. A photoresist film was then formed on the electroless plated copper film and a resist pattern was thereafter formed by exposing and developing the photoresist. This resist pattern had a pattern shape corresponding to the wiring pattern that was the object of formation. Then, an electroplated Cu film was deposited on the electroless plated film that was not masked with the resist pattern by electroplating process by using the electroless plated copper film as a seed layer. Then, after the resist pattern has been removed, the electroless plated copper film that was heretofore covered with the resist pattern was etched out. With such a semi-additive method, the wiring patterns were formed on the insulating layers on both sides and via contacts were formed in the insulating layer on the first surface side.

The above-described sequence of steps from the lamination formation of the insulating layers to the formation of wiring patterns and via contacts was then repeated four times on both surfaces of the core board to form buildup sections with five-layer wiring structures on both sides of the core board.

Then, an overcoat layer was formed on the surface of the buildup section on the first surface side by screen printing and photolithography. In the prescribed location of the overcoat layer, openings were provided so as to expose parts of the uppermost wiring pattern present in the buildup section as electrode pads. Then, a Ni plated film (thickness 5 µm) and thereupon a Au plated film (thickness 0.1 µm) were successively formed by an electroless plating method.

The buildup section on the first surface side was then covered with a dry film resist as a protective film and the buildup section on the second surface side was removed by polishing. As a result, the core material (42 Alloy sheet) of the core board was exposed. Then, a resist pattern was formed on the surface exposed in the core material. This resist pattern had the above-described openings in the locations corresponding to the electrode pads that were formed in contact with the core board, that is, in the locations corresponding to the chip mounting areas.

Then, the core material was etched till the intermediate layer was exposed, by using the resist pattern as a mask. An aqueous solution of ferric chloride was used as the etchant. The intermediate layer was then subjected to etching by RIE using an oxygen gas till the spacer material (electrolytic copper foil) was exposed; the core material served as a mask. A resist pattern was then formed on the surface exposed in the spacer material. The resist pattern served to mask the location where the spacers were to be formed in the spacer material.

The spacer material was then subjected to etching till the insulating layer of the lowermost layer on the first surface side and the electrode pads embedded in this insulating layer were sufficiently exposed by using the resist pattern as a mask. An aqueous solution of copper chloride was used as the etching solution. As a result, through holes for chip accommodation were formed in the core board and chip mounting areas were exposed on the core board side of the buildup section. At the same time, spacers were formed on the chip mounting areas. Then, the resist pattern for spacer formation was stripped. The board was then split into individual pieces, that is, to the package size. A plurality of wiring boards for chip mounting were thus formed.

Semiconductor chips that were separately prepared were flip-chip mounted on the wiring boards. The semiconductor chips had bump electrodes for external connection. The bump electrodes were provided correspondingly to the electrode pads of the wiring boards and were composed of a solder (composition: Sn-3 wt % Ag-0.5 wt % Cu, melting point 220° C.).

In the chip mounting process, first, the semiconductor chip was fixed to the first heat plate and then the first heat plate was attached by suction with a suction cullet and ethylene glycol was coated as an oxidation-preventing agent on the bump electrodes of the of the semiconductor chip. On the other hand, the wiring board was fixed to the second heat plate. The first and second heat plates had a temperature-adjustable heat generation function. Then, the semiconductor chip was heated to a temperature of 255° C. with the first heat plate and the wiring board was heated to a temperature of 150° C. with the second heat plate. Then, the bump electrodes of the semiconductor chip and the electrode pads of the wiring board were abutted against each other by operating the suction collet and in this state the semiconductor chip was pressed against the wiring board. In the pressed state, heating with the first and second heat plates was terminated, the temperature of the semiconductor chip and the wiring board was decreased, and they were fully cooled. As a result, the bump electrodes of the semiconductor chip were soldered to the electrode pads of the wiring boards.

The through hole of the core board was then filled with an underfill agent and the semiconductor chip was sealed. In this case, the space between the semiconductor chip and the buildup section was also filled with the underfill agent. The chip-mounted boards of the present working example was thus fabricated.

The invention claimed is:

1. A method for manufacturing an electronic component-mounted board, the method comprising:
    fabricating a wiring board comprising a core board and a buildup section, the core board comprising a laminated structure including a core layer and a spacer layer, the buildup section being formed on the spacer layer and comprising a laminated structure including a wiring pattern and an insulating layer, the build up section being provided with an electrode section held in contact with the spacer layer;
    removing a part of the core layer that corresponds to the electrode section by conducting etching of the core layer from a side opposite to the buildup section;
    conducting etching of the spacer layer from a side opposite to the buildup section to expose the electrode section and to form a protrusion as a remaining part of the spacer layer, the protrusion projecting from a surface of the buildup section at a portion of the buildup section other than the electrode section of the buildup section; and
    mounting an electronic component including a bump electrode on the wiring board by joining the bump electrode and the electrode section of the buildup section, with the protrusion contacting a portion of the electronic component other than the bump electrode.

2. The method according to claim 1, wherein the bump electrode contains a solder material, the method further comprising:
    heating the electronic component to a first temperature higher than a melting point of the solder material, the wiring board being heated to a second temperature lower than the first temperature; and
    joining the solder bump electrode and the electrode section by abutting the solder bump electrode and the electrode section against each other and pressing the electronic component against the wiring board.

3. The method according to claim 2, wherein the second temperature is lower than the melting point of the solder material.

4. The method according to claim 2, further comprising causing ethylene glycol, triethylene glycol, or tetraethylene glycol to adhere to the solder bump electrode prior to heating the electronic component.

* * * * *